United States Patent [19]

Heiman et al.

[11] 4,271,232
[45] Jun. 2, 1981

[54] AMORPHOUS MAGNETIC FILM

[75] Inventors: Neil D. Heiman, Morgan Hill; Robert L. White, Los Altos Hills; Robert I. Potter; Paul A. Albert, both of San Jose, all of Calif.

[73] Assignee: International Business Machines Corporation, Armonk, N.Y.

[21] Appl. No.: 937,686

[22] Filed: Aug. 28, 1978

[51] Int. Cl.³ ............................................. H01F 10/07
[52] U.S. Cl. .................... 428/332; 252/62.55; 252/62.56; 360/134; 360/135; 360/136; 365/34; 428/336; 428/900; 428/694
[58] Field of Search ............... 360/134, 135, 136, 131; 428/900, 332, 928, 336, 539; 252/62.55, 62.56, 62.51 R; 204/192 M; 75/123 B; 365/34

[56] References Cited

U.S. PATENT DOCUMENTS

| | | | |
|---|---|---|---|
| 3,607,460 | 9/1971 | Lommel | 148/108 |
| 3,620,841 | 11/1971 | Comstock | 252/62.56 |
| 3,700,499 | 10/1972 | Haack et al. | 252/62.51 R |
| 3,965,463 | 6/1976 | Chaudhari et al. | 365/34 |
| 4,002,546 | 1/1977 | Shirahata | 204/192 M |
| 4,003,813 | 1/1977 | Hattori | 204/192 M |
| 4,013,803 | 3/1977 | Josephs | 204/192 M |
| 4,067,732 | 1/1978 | Ray | 75/123 B |
| 4,144,058 | 3/1979 | Chen et al. | 75/123 B |

FOREIGN PATENT DOCUMENTS

| | | | |
|---|---|---|---|
| 51-97545 | 8/1976 | Japan | 204/192 M |
| 2016528 | 9/1974 | United Kingdom | 204/192 M |

OTHER PUBLICATIONS

Cuomo et al., IBM Technical Disclosure Bulletin, vol. 17, No. 2, Jul. 1974, Sputtering of Amorphous Fe-Gd Alloys.

Primary Examiner—Stanley S. Silverman
Attorney, Agent, or Firm—Pollock, Vande Sande & Priddy

[57] ABSTRACT

A magnetic material of amorphous iron-nitride and a method for preparing the same are provided.

7 Claims, 2 Drawing Figures

AMORPHOUS MAGNETIC FILM

FIELD OF THE INVENTION

The present invention relates generally to a new magnetic material and more specifically to an amorphous magnetic alloy especially suitable for use as magnetic recording media.

BACKGROUND OF THE INVENTION

There has been a demand for magnetic material having a high coercive force as well as high mechanical hardness for use, especially as a film for magnetic recording media. The material must be hard to resist impacts from a flying magnetic head slider and be resistant to corrosion. A thin film of a magnetic material is needed in order to increase the density of magnetic transitions formed on the magnetic material by the magnetic transducer. Particulate magnetic recording media are limited in density by the size of the magnetic materials and the binder which limits the lower level of thickness which can be accomplished.

Magnetic recording media comprise important memory units in electronic computers, especially for magnetic memory discs. An object of the present invention, therefore, is to provide a new magnetic material useful as magnetic recording media.

It is known that conventional particulate ferromagnetic materials such as iron oxide and chromium dioxide can be dispersed into an organic binder to form a coating layer type of magnetic recording medium. However, ferromagnetic metallic thin films produced by vacuum or vapor deposition have attracted special interest because of the relative thinness of the resultant magnetic layer.

Electroless plated thin films of cobalt or nickel are well known as evidenced by the many issued patents in this area.

Iron rhodium has been suggested as magnetic recording media as exemplified by U.S. Pat. No. 3,607,460 to J. M. Lommell. This patent suggests depositing iron and rhodium as separate layers and then annealing to defuse the layers.

Further thin film magnetic recording medium comprises a magnetite film prepared by forming a film of $Fe_2O_3$ as disclosed in U.S. Pat. No. 3,620,841 to R. L. Comstock et al and assigned to the assignee of the present application.

In many of the patents, the magnetic film is formed on the substrate by conventional electroplating or evaporation plating such as vapor deposition, sputtering, or ion plating. The magnetic film is made of metal generally, for example, ferromagnetic metals such as iron, cobalt, nickel, and the like or ferromagnetic alloys including a combination of the ferromagnetic metals with the addition of certain materials for specific purposes. For instance, platinum and rhodium have been included with the ferromagnetic materials to accomplish a magnetic recording media.

Also, as suggested in U.S. Pat. No. 4,002,546, magnetic recording media of a cobalt silicon alloy can be ion plated.

It is further known that amorphous alloys can be formed having magnetic properties. For instance, the article, appearing in the Journal of Applied Physics, Volume 47, No. 10, October 1976 at pages 4660-2 entitled "Low-Field Magnetic Properties of $Fe_{80}B_{20}$ Glass" by R. C. O'Handley et al, discusses the magnetic properties of metallic glasses. These magnetic glasses have extremely low coercivity which renders them unsuitable for magnetic recording media. Similar amorphous transition metal alloys such as iron carbon, iron phosphorous, and so forth are all very soft magnetic materials. The only examples of a high coercivity amorphous alloy involve ferromagnetic amorphous, rare earth-transition metal alloys near the compensation temperature or similar rare earth-transition metal alloys containing highly anisotropic atoms such as terbium.

Accordingly, an object of the present invention is to provide an amorphous magnetic material that has high coercivity.

A further object of the present invention is to provide a new amorphous magnetic material having properties rendering it useful as a magnetic recording media. In addition, an object of the present invention is to provide an enchanced magnetic material having relatively high coercivity along with good corrosion resistance. It is a further object of the present invention to provide thin films which are mechanically strong and are relatively resistant to wear.

SUMMARY OF THE INVENTION

The present invention relates to a new film magnetic material which comprises an amorphous iron-nitride layer which is particularly useful as magnetic recording media. The amorphous iron-nitride layer contains from about 70 to more than 40 atomic percent of iron and from about 30 to less than 60 atomic percent of nitrogen.

The amorphous iron-nitride films are prepared by diode sputter deposition techniques in an inert gas.

DESCRIPTION OF PREFERRED EMBODIMENTS

Figure 1:
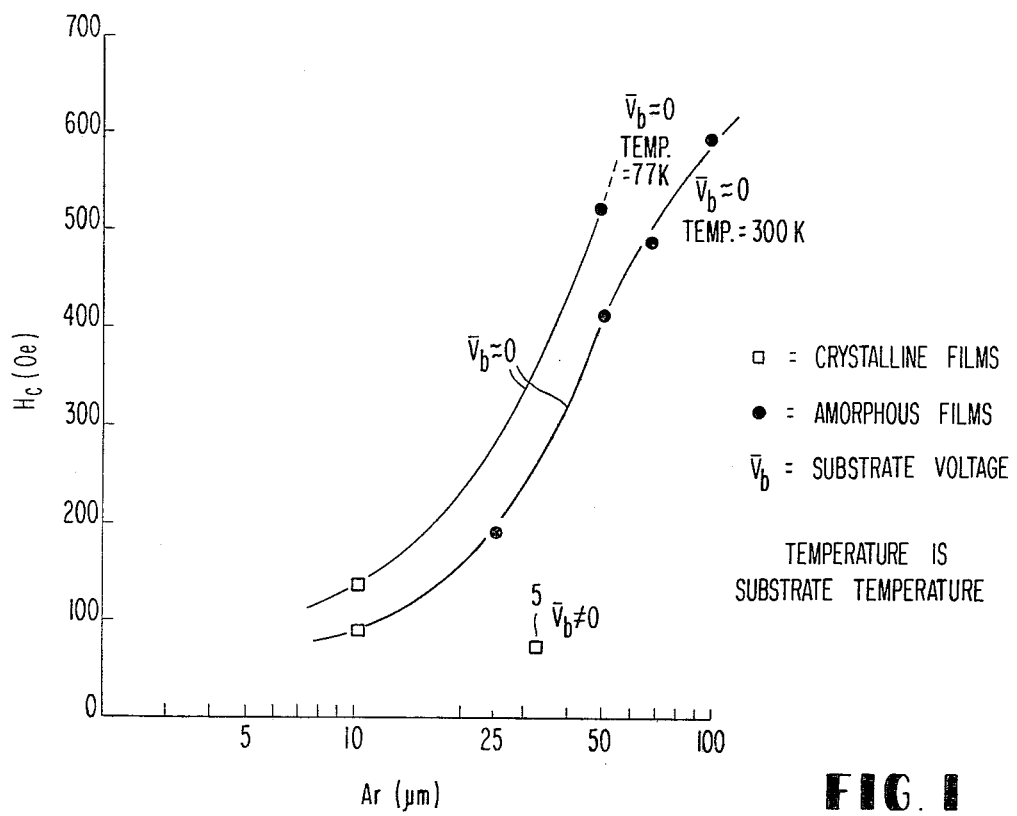
FIG. 1 is a graph which illustrates the effect of gas pressure upon the coercivity ($H_c$) of the deposition film.

The films to which the present invention is directed are amorphous films of iron-nitride. In order for the films to be both magnetic as well as having relatively high coercivity, it is preferred that the films contain Fe in an atomic percent of >40 to about 70, and preferably about 50 to about 70, and N in atomic percents of 30 to <60, and preferably about 30 to about 50. The atomic percents are based upon the total atoms of Fe and N in the film.

It has been observed that if the atomic percent of nitrogen present in the film is less than about 30%, then the film loses its high coercivity properties. Moreover, films containing more than about 60 atomic percent nitrogen are not sufficiently magnetic to serve as magnetic recording media at room temperature.

In addition, the films produced might include relatively minor amounts of impurities (e.g., up to about 2 atomic percent). For instance, minor amounts of the inert gas, such as argon (e.g., up to about 2 atomic percent) employed in the sputter deposition technique, might be present in the final film. Moreover, other alloying elements including chromium can be present so long as the amounts and type can be incorporated without destroying the amorphous and magnetic characteristics of the film.

The present invention makes it possible to provide amorphous films having high coercivity such as at least about 400 oersteds. In addition, the films obtained from the present invention are magnetic and have values of $4\pi M$ up to about 12 kgauss.

The iron-nitride amorphous films of the present invention exhibit corrosion resistance as apparent from FIG. 2 and as will be discussed hereinbelow. The iron-nitride films of the present invention have good mechanical hardness properties and are resistant to wear.

In view of the above good combination of mechanical and magnetic properties, the amorphous films of the present invention are particularly useful as magnetic recording media. The amorphous nature of the films offers the additional advantage of lack of media noise associated with finite grain size. The amorphous films of the present invention are easy to passivate.

The films of the present invention are produced by cathode diode sputter deposition onto a suitable substrate.

In sputtering techniques, the material to be deposited and the substrate upon which it is to be deposited are placed in a partial vacuum. A high potential is then applied between an electrode and the material to be deposited (e.g., metal alloy) and the gaseous ions created by the high potential strike the surface of the metal with an energy sufficient to cause atoms from the metal to enter the vapor phase; these atoms then condense to the solid state on the surface exposed to the vapor. Sputtering techniques are described in detail in "Handbook of Thin Film Technology", L. I. Maissel and R. Glang, McGraw-Hill, 1970.

According to the present invention, the gas employed must include an inert gas such as halium, neon, argon, krypton, xenon, and radon. The preferred gas is argon. In addition, the gaseous medium can contain amounts of other gases such as nitrogen; provided, the amount and type of gas are not such as to adversely affect the desired properties of the film to an unacceptable extent.

It has been observed that the coercivity of the magnetic material varies as a function of the gas pressure employed during the sputtering. For instance, FIG. 1 is a graph of the coercivity ($H_c$) as a function of the pressure of argon during sputter deposition. As shown in FIG. 1, $H_c$ rose from less than 100 oersteds with 10 $\mu m$ argon pressure to over 550 oersteds with 100 $\mu m$ argon pressure for substrates at room temperature (300° K.). As indicated, films deposited at low argon pressure were crystalline or partially crystalline while those deposited at higher argon pressures were amorphous as determined by x-ray diffraction. There appears to be a correlation between the amorphous nature of the film and relatively large coercivity values. When employing argon in the gas, it is preferred that the pressure be greater than about 25 $\mu m$. The maximum pressure to employ is primarily determined by practical and economical considerations. For instance, pressures greater than about 100 $\mu m$ begin to cause some difficulties in the sputtering technique. Accordingly, it is preferred that the pressure be no greater than about 100 $\mu m$.

In addition, as illustrated in FIG. 1, films which were deposited onto substrates at reduced temperatures (77° K.) were slightly higher in coercivity than those deposited on substrates at room temperature. The temperature of the substrate during sputter deposition has a limited effect upon the coercivity of the deposited film.

Moreover, it has been observed that when an electrical bias is applied to the substrate, the films deposited tend to become more crystalline and accordingly lower in coercivity. Therefore, it is preferred not to bias the substrate.

It is essential in producing the amorphous films according to the present invention that an inert gas be employed. For instance, films which were sputter deposited in pure nitrogen were not magnetic. It is believed that the use of pure nitrogen increased the amount of nitrogen in the deposited film to a value greater than about 60 atomic percent, which is not desirable. However, as discussed hereinabove, mixtures of inert gas and nitrogen can be employed so long as the amount of nitrogen relative to the inert gas is not so large that it results in such an increased nitrogen level in the deposited films that the film is nonmagnetic.

The thickness of the film was not a significant factor with respect to the properties of the film. The thickness of the film can vary to a great extent.

The substrate upon which the film is deposited can vary widely and is not crucial to the practice of the present invention and it is preferred that the deposited film is adherent thereto and that the substrate is compatible with the intended use of the material.

When the films of the present invention are for use as magnetic recording media, it is preferred that the substrate be a material which is stable at the temperatures encountered during deposition, and which preferably may be formed with a smooth surface. Examples of suitable substrates include quartz, glasses, ceramics, paper, synthetic resins such as polyethylene terephthalate, polyamides, polyimides, polyethylene, polyvinyl chloride, copolymers of vinyl chloride and vinyl acetate, copolymers of vinyl chloride and vinylidene chloride, polyvinyl alcohol, polycarbonate, polytetrafluoroethylene, polychlorotrifluoroethylene, polystyrene, rubber hydrochloride, vinyl nitrite rubber, regenerated cellulose, cellulose acetate, cellulose triacetate, cellulose acetate butyrate, cellulose nitrate, ethyl cellulose and polymethylmethacrylate, and metals or alloys such as aluminum, copper, brass, and stainless steel.

The thickness of the substrate is not crucial to the practice of the present invention and is primarily determined by practical and economical considerations. For instance, amorphous films of the present invention of thicknesses up to about 2 microns have been deposited on quartz of about 20 mils thickness and glass of about 2 mils thickness.

The following examples are provided to further illustrate the present invention.

EXAMPLE 1

A $Fe_{0.5}N_{0.5}$ 3" diameter pressed powder target obtained from Cerac and a 20 mil quartz substrate are placed in a sputtering apparatus under an argon atmosphere at a pressure of about 100 $\mu m$. The substrate is maintained at about room temperature, about 1.5" from the target, and is at ground potential. The target is maintained at a potential of about −1500 volts. The process is continued for about 2500 seconds whereby a film of about 2 microns is formed. The film is amorphous, has a coercivity of about 600 Oe, and is represented by the formula $Fe_aN_b$ wherein a is about 0.58 and b is about 0.42.

EXAMPLE 2

Example 1 is repeated except that the argon pressure is about 75 μm. The film is amorphous, has a coercivity of about 550 oersteds and is represented by the formula $Fe_aN_b$ wherein a is about 0.6 and b is about 0.4.

EXAMPLE 3

Example 1 is repeated except that the argon pressure is about 60 μm and the time is about 2400 seconds. The film is amorphous, has a coercivity of about 500 oersteds, and is represented by the formula $Fe_aN_b$ wherein a is about 0.6 and b is about 0.4.

EXAMPLE 4

Example 1 is repeated except that the argon pressure is about 50 μm. The film is amorphous, has a coercivity of about 400 oersteds, and is represented by the formula $Fe_a N_b$ wherein a is about 0.64 and b is about 0.36.

EXAMPLE 5

Example 1 is repeated except that the argon pressure is about 25 μm. The film is amorphous, has a coercivity of about 200 oersteds, and is represented by the formula $Fe_aN_b$ wherein a is about 70 and b is about 30.

COMPARISON EXAMPLE 6

Example 5 is repeated except that a bias of about 50 volts is applied to the substrate. The film is crystalline with a coercivity of only about 40 oersteds and is not suitable for magnetic recording media. This example is shown by the point marked 5 in FIG. 1.

EXAMPLE 7

Example 4 is repeated except that the temperature of the substrate is about 77° K. The film is amorphous, has a coercivity of about 550 oersteds, and is represented by the formula $Fe_aN_b$ wherein a is about 63 and b is about 37.

EXAMPLE 8

Example 1 is repeated except that the argon pressure is about 10 μm. The film is crystalline, has a coercivity of only about 90 oersteds, and is not suitable for magnetic recording media.

EXAMPLE 9

Example 1 is repeated except that the argon pressure is about 10 μm and the substrate temperature is about 77° K. The film is crystalline, has a coercivity of only about 150 oersteds, and is unsuitable for magnetic recording media.

The coercivities of the films of Examples 1–9 are shown at the varying pressures and conditions in FIG. 1. The films of Examples 1–5 and 7 have a magnetization of 4πM of approximately 10.1±2 kilogauss. It is found that for films sputter deposited at 50 microns or more of argon pressure, the coercivity is equal to or greater than about 400 oersteds, and cooling the substrate produced additional increases in the coercivity. It was noted that films which were annealed at 250° C. for 29 hours resulted in only a small decrease in the coercivity, but were still quite suitable for magnetic recording media.

EXAMPLE 10

The amorphous film prepared according to the procedure of Example 1 is tested for corrosion resistance by placing in a corrosion testing chamber having a gas mixture of 300 ppb $SO_2$, 400 ppb $NO_2$, 3 ppb $Cl_2$, and 40 ppb $H_2S$ at 20° C. and 70% relative humidity. The linear flow rate of the gas is about 100 feet/minute. The film shows no weight gain for 3 days.

EXAMPLE 11

Example 10 is repeated except that the film prepared according to the procedure of Example 2 is placed in a corrosion testing chamber. This film survived 11 days in the chamber with a total weight gain of 4.4 μg/cm². This is the example illustrated in FIG. 2 labeled amorphous.

COMPARISON EXAMPLE 12

Films prepared in the same general manner as Example 2, except that varying amounts of chromium were added to the target, are tested in a corrosion testing chamber for corrosion resistance. The films are partially crystalline and contain from about 6 to about 15 atomic percent chromium. The results obtained are illustrated in FIG. 2.

Figure 2:
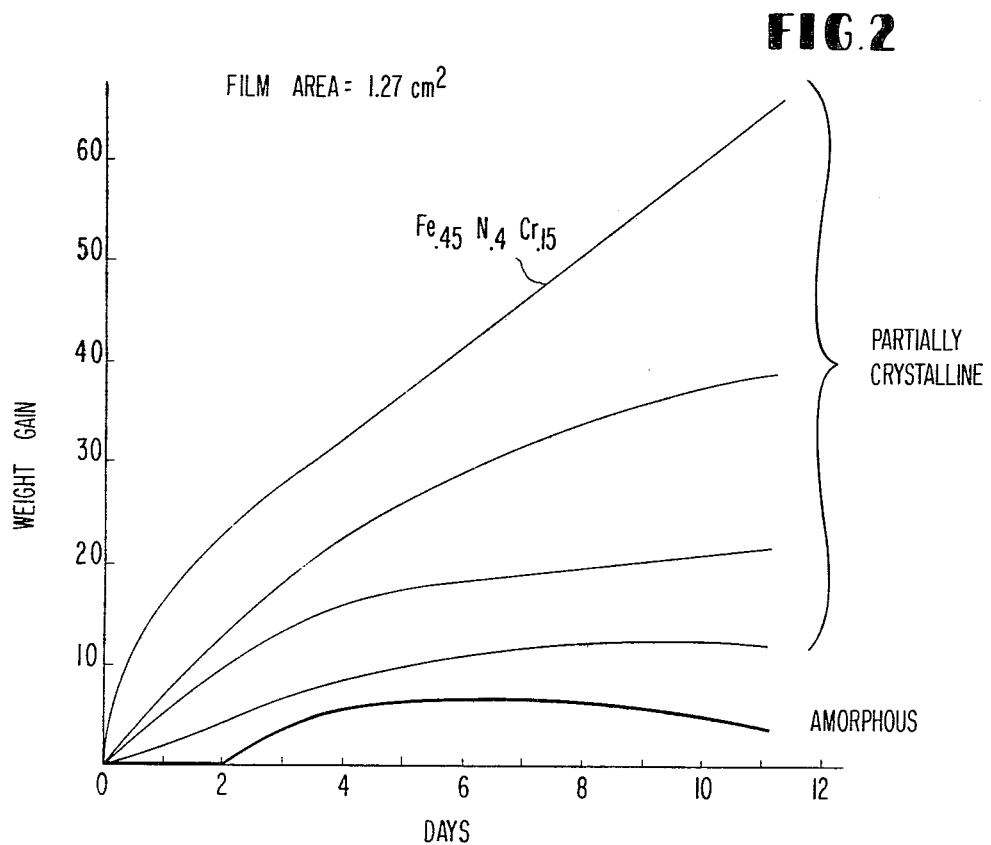
FIG. 2 is a graph which illustrates the corrosion behavior of amorphous film prepared according to the present invention as compared to partially crystalline films which also contain chromium.

FIG. 2 is a graph of increase in weight in μ-gr plotted against time in chamber in days. All films tested have a surface area of about 1.27 cm². These chromium containing films had higher corrosion rates than the films of the present invention.

The films of the present invention exhibit good corrosion resistance as compared to crystalline films containing iron and nitrogen. It is noted that the film which contained about 15 atomic percent chromium, 45 atomic present iron, and 40 atomic percent N had the highest corrosion rate.

It is seen from the above examples that in order for the films to have both high coercivity coupled with high corrosion resistance, that such films must be amorphous.

In addition, the amorphous films according to the present invention exhibit good hardness characteristics and are resistant to wear.

What is claimed is:

1. A thin film magnetic material for use as magnetic recording media comprising an amorphous iron-nitride film having a coercivity of at least about 200 oersteds and high corrosion resistance and wherein the atomic percent of of Fe in said material is from about 70 to >40% and the atomic percent of N in said material is from about 30 to <60%, said atomic percent being based upon the total atoms of Fe and N in the material.

2. The material of claim 1 wherein said film has a coercivity of at least about 400 oersteds.

3. The material of claim 2 wherein said film contains 0 to 2 atomic percent argon.

4. The material of claim 1 wherein said atomic percent of Fe in said material is from about 70 to about 50% and said atomic percent of N in said material is from about 30% to about 50%.

5. The material of claim 1 wherein coercivity is about 600 oersteds.

6. The method of claim 1 wherein said atomic percent of Fe in said material is from about 58 to about 70% and said atomic percent of N in said material is from about 30 to about 42%.

7. The material of claim 1 wherein said atomic percent of Fe in said material is from about 58 to about 64% and said atomic percent of N in said material is from about 36 to about 42%.

* * * * *